(12) United States Patent
Aoki et al.

(10) Patent No.: US 11,670,527 B2
(45) Date of Patent: Jun. 6, 2023

(54) SUBSTRATE PROCESSING APPARATUS

(71) Applicant: Tokyo Electron Limited, Tokyo (JP)

(72) Inventors: Daisuke Aoki, Koshi (JP); Junya Minamida, Kumamoto (JP); Yasunori Toyoda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 278 days.

(21) Appl. No.: 16/733,317

(22) Filed: Jan. 3, 2020

(65) Prior Publication Data

US 2020/0219736 A1 Jul. 9, 2020

(30) Foreign Application Priority Data

Jan. 8, 2019 (JP) .............................. JP2019-001269

(51) Int. Cl.
*H01L 21/67* (2006.01)
*H01L 21/677* (2006.01)
*H01L 21/673* (2006.01)

(52) U.S. Cl.
CPC .... *H01L 21/6715* (2013.01); *H01L 21/67393* (2013.01); *H01L 21/67772* (2013.01)

(58) Field of Classification Search
CPC ...................... H01L 21/6715; H01L 21/67393
See application file for complete search history.

(56) References Cited

U.S. PATENT DOCUMENTS

| | | | | |
|---|---|---|---|---|
| 8,393,370 B2 * | 3/2013 | Mitsumoto | ............. | B32B 38/18 414/217 |
| 2007/0119816 A1 * | 5/2007 | Urquhart | ............. | H01L 21/6715 216/84 |
| 2011/0155181 A1 * | 6/2011 | Inatomi | ............. | H01L 21/02052 134/30 |
| 2013/0122799 A1 * | 5/2013 | Maherault | ......... | H01L 21/67393 454/254 |
| 2015/0000517 A1 * | 1/2015 | Yoshihara | ................ | G03F 7/16 95/1 |
| 2016/0288032 A1 * | 10/2016 | Shite | ................... | H01L 21/6715 |
| 2019/0295863 A1 * | 9/2019 | Inagaki | ............. | H01L 21/67178 |
| 2021/0327737 A1 * | 10/2021 | Sakata | ............. | H01L 21/67393 |

FOREIGN PATENT DOCUMENTS

| JP | 2001-102374 A | | 4/2001 | |
|---|---|---|---|---|
| WO | WO-2020012669 A1 * | | 1/2020 | ....... H01L 21/67393 |

* cited by examiner

*Primary Examiner* — Kaitlin S Joerger
(74) *Attorney, Agent, or Firm* — Pearne & Gordon LLP

(57) ABSTRACT

A substrate processing apparatus includes a first atmosphere control system configured to control an atmosphere inside a processing zone of a substrate processing area and a second atmosphere control system configured to control an atmosphere inside a substrate transfer zone of the substrate processing area. The first atmosphere control system supplies, when a liquid processing is performed in a liquid processing unit, an atmosphere control gas to the corresponding liquid processing unit by a first gas supply, and discharges an atmosphere inside the corresponding liquid processing unit by a first gas discharge unit. The second atmosphere control system circulates an atmosphere adjustment gas in a circulation system of the corresponding second atmosphere control system, and discharges an atmosphere inside the circulation system of the second atmosphere control system when at least one of the liquid processing unit is opened to the substrate transfer zone.

15 Claims, 4 Drawing Sheets

SUBSTRATE PROCESSING APPARATUS

CROSS-REFERENCE TO RELATED APPLICATION

This application claims the benefit of Japanese Patent Application No. 2019-001269 filed on Jan. 8, 2019, the entire disclosure of which is incorporated herein by reference.

TECHNICAL FIELD

The embodiments described herein pertain generally to a substrate processing apparatus.

BACKGROUND

To manufacture a semiconductor device, various processings are performed on a semiconductor wafer (substrate). Patent Document 1 discloses a film forming system serving as a substrate processing apparatus for forming an insulating film on a wafer. The film forming system includes a first processing station, a second processing station, and an interface section that delivers the wafer between the first processing station and the second processing station. In the first processing station, a coating device configured to supply a coating solution to the wafer is provided. In the second processing station, a heating device (heat treatment furnace) configured to vaporize a solvent in the coating solution on the wafer is provided. In the interface section, a wafer transfer body configured to transfer the wafer and a placing table configured to temporarily place the wafer thereon before and after the processing performed by the heating device are provided.

The heating device is equipped with a gas supply device configured to supply a nitrogen gas into a processing chamber of the heating device and an exhaust device configured to exhaust an inside of the processing chamber. The inside of the processing chamber is set to a low-oxygen atmosphere by these devices. A region where the second processing station and the interface section are placed is surrounded by panels. To set the region to a low-oxygen atmosphere, a nitrogen gas is supplied into the region. Accordingly, it is possible to suppress oxidation of the coating film on a surface of the wafer.

Patent Document 1: Japanese Patent Laid-open Publication No. 2001-102374

SUMMARY

In one exemplary embodiment, a substrate processing apparatus comprises a substrate processing area including a processing zone in which at least one liquid processing unit configured to perform a liquid processing on a substrate is provided and a substrate transfer zone in which a substrate transfer mechanism configured to transfer the substrate to the at least one liquid processing unit is provided; a substrate transfer area including a substrate transfer device configured to take out the substrate from a substrate accommodating container held by a container holder and transfer the substrate to a position allowed to be accessed by the substrate transfer mechanism of the substrate processing area; a first atmosphere control system configured to control an atmosphere inside the processing zone of the substrate processing area; and a second atmosphere control system configured to control an atmosphere inside the substrate transfer zone of the substrate processing area. The first atmosphere control system includes a first gas supply and a first gas discharge unit, and when the liquid processing is performed in each of the at least one liquid processing unit, an atmosphere control gas is supplied to the at least one liquid processing unit by the first gas supply and an atmosphere inside the at least one liquid processing unit is discharged by the first gas discharge unit. The second atmosphere control system includes a circulation system having the substrate transfer zone of the substrate processing area and a circulation conduit connected to the substrate transfer zone, a second gas supply configured to supply an atmosphere control gas to the circulation system of the second atmosphere control system and a second gas discharge unit configured to discharge an atmosphere inside the circulation system of the second atmosphere control system, and the second atmosphere control system is configured to circulate an atmosphere adjustment gas within the circulation system of the second atmosphere control system, and when at least one of the at least one liquid processing unit is opened to the substrate transfer zone, the second atmosphere control system is configured such that an atmosphere inside the circulation system of the second atmosphere control system is discharged by the second gas discharge unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
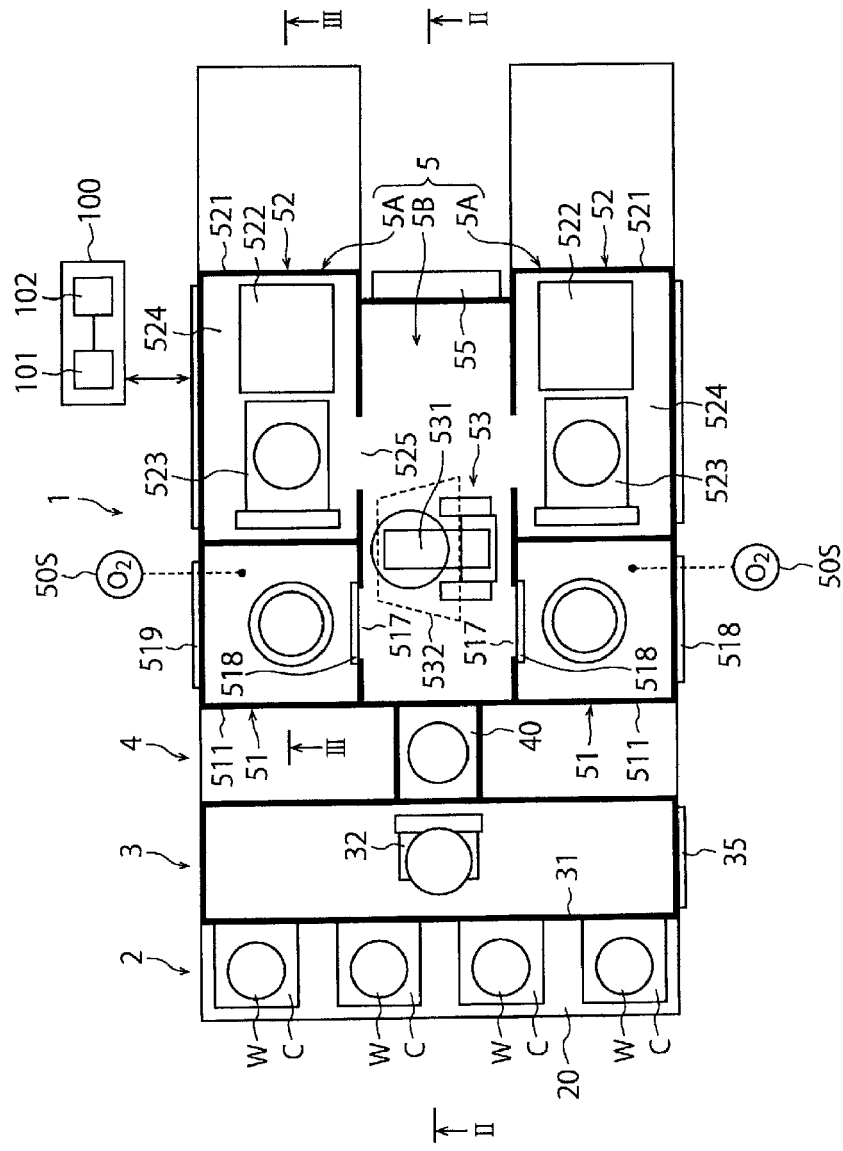
FIG. 1 is a schematic plan view illustrating a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current embodiment. Still, the embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
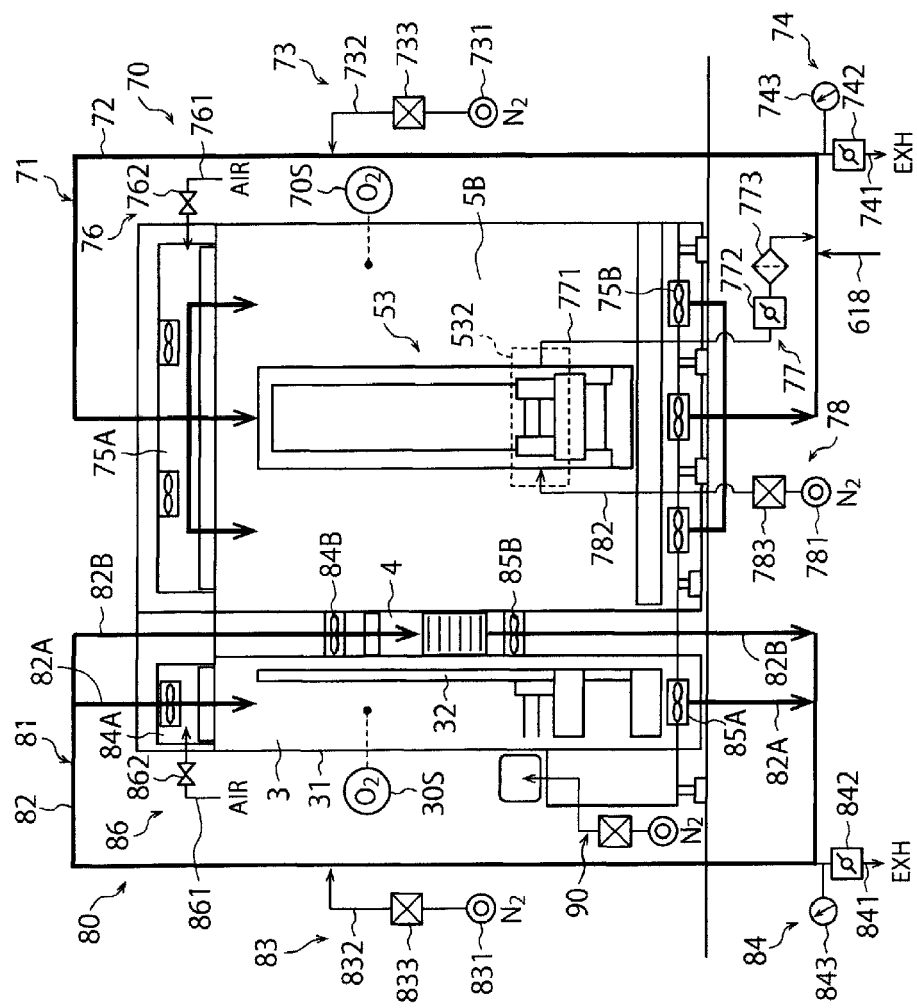
FIG. 2 is a schematic longitudinal cross-sectional view taken along a line II-II of the substrate processing apparatus shown in FIG. 1.
Figure 3:
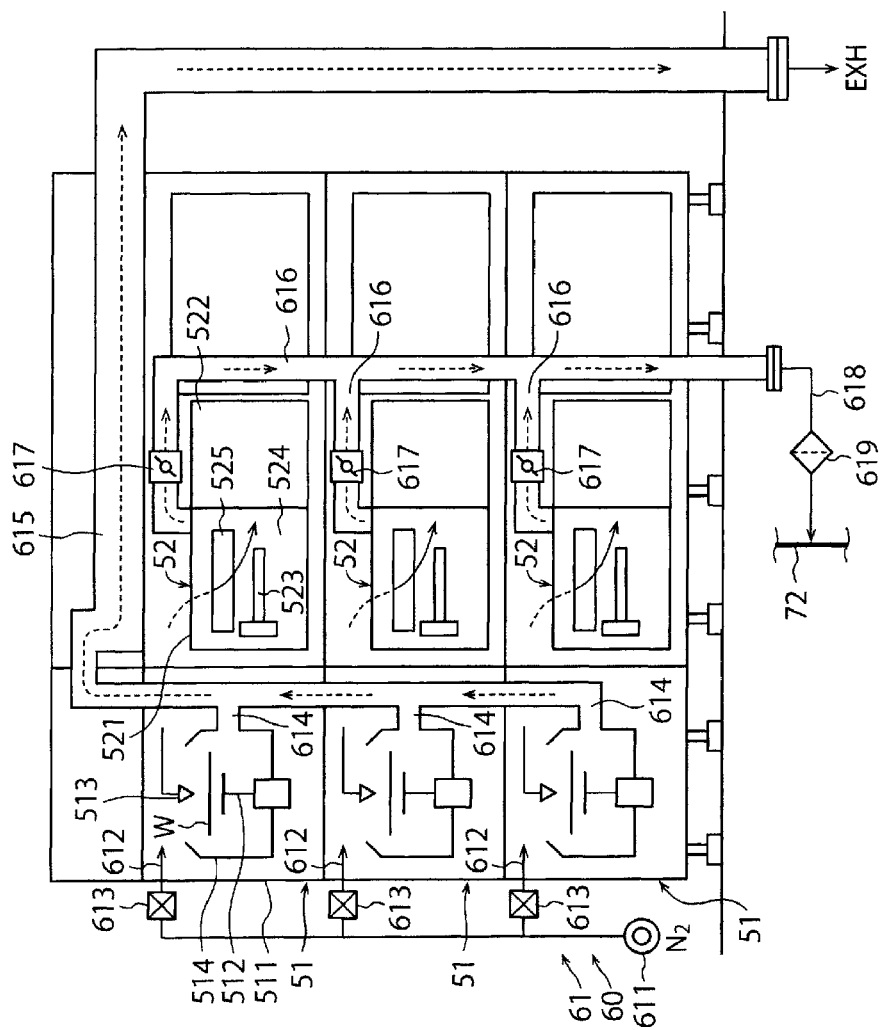
FIG. 3 is a schematic longitudinal cross-sectional view taken along a line III-III of the substrate processing apparatus shown in FIG. 1.

Hereinafter, a substrate processing apparatus according to an exemplary embodiment will be described with reference to the accompanying drawings. As shown in FIG. 1 to FIG. 3, a substrate processing system 1 includes a carry-in/out section 2, a substrate transfer area 3, an interface section (connection section) 4, and a substrate processing area 5. The substrate transfer area 3, the interface section 4 and the substrate processing area 5 are accommodated in a housing that covers the whole substrate processing system 1.

The carry-in/out section 2 includes a container holder 20 (also referred to as "load port"), and a plurality of substrate accommodating containers C (hereinafter, simply referred to as "containers C") may be placed on the container holder 20. Each of the containers C is, e.g., a carrier of a type called a Front-Opening Unified Pod (FOUP). A plurality of substrates W (e.g., semiconductor wafers) is accommodated at equal intervals in a vertical direction horizontally within the container C. An outer surface of the container C placed on the container holder 20 is exposed to an atmosphere inside a clean room where the substrate processing system 1 is provided.

A plurality of doors is provided on a front panel 31 (see FIG. 1 and FIG. 2) of the substrate transfer area 3. Each door is equipped with opening device and an adsorption device for a cover of the container C, so that the cover of the container C placed on the container holder 20 can be opened. When the cover of the container C is opened, an inner space of the container C communicates with an inner space of the substrate transfer area 3. At this time, since an edge of an opening portion of the container C and the front panel 31 of the substrate transfer area 3 are in close contact with each other, the atmosphere in the clean room is not introduced into the inner space of the container C and the inner space of the substrate transfer area 3. When the container C accommodating a substrate W is carried into the substrate processing system 1, an inside of the container C is sealed in a nitrogen gas atmosphere. The components (the cover, the cover opening device, and the cover adsorption device) disclosed in this paragraph are well known in the technical field of semiconductor manufacturing apparatuses and are not illustrated in the drawings.

A substrate transfer device 32 is provided within the substrate transfer area 3. A delivery unit 40 (also referred to as "transition unit", "buffer unit" or the like) is provided in the interface section 4. The delivery unit 40 may hold the plurality of substrates W in the vertical direction horizontally with an interval therebetween. The substrate transfer device 32 may take out a substrate W from the container C, which is placed on the container holder 20 and whose cover is opened, and then, carry the substrate W into the delivery unit 40.

In the present specification, each of the "substrate transfer area 3" and a "substrate transfer zone 5B" to be described later refers to an area (or zone) to which a substrate W is transferred by the substrate transfer device 32 and a substrate transfer mechanism 53 to be described later. Both the substrate transfer device 32 and the substrate transfer mechanism 53 may access the delivery unit 40 to deliver the substrate W.

A well-known multi-joint transfer robot or a well-known multi-axis transfer robot may be used as the substrate transfer device 32 and the substrate transfer mechanism 53. In the accompanying drawings, the multi-axis transfer robot is schematically illustrated.

Instead of the single delivery unit 40, a first delivery unit configured to hold only a substrate W which has not yet been processed in the substrate processing area 5 and a second delivery unit configured to hold only a substrate W which has already been processed in the substrate processing area 5 may be provided.

A processing zone 5A and the substrate transfer zone 5B are provided within the substrate processing area 5. The processing zone 5A refers to a zone where a plurality of processing units 51 and 52 configured to perform processings on the substrate is provided. The processing zone 5A is provided at both sides of the substrate transfer zone 5B.

In the present embodiment, the plurality of processing units 51 and 52 includes a plurality of liquid processing units 51 and a plurality of drying units 52.

As illustrated in FIG. 3, each of the liquid processing units 51 includes a unit casing (also referred to as "chamber") 511 and a processing device provided within the unit casing 511. In the present exemplary embodiment, the processing device includes a spin chuck 512 (substrate holding/rotating device) configured to rotate a substrate W around a vertical axis while maintaining the substrate W in a horizontal posture; one or more nozzles 513 configured to supply a processing fluid (e.g., chemical liquid, rinse liquid, or dual-fluid) to the substrate W; and a cup body 514 disposed to surround a periphery of the substrate W.

The liquid processing unit 51 further includes a nitrogen gas supply 61 configured to supply a nitrogen gas as an atmosphere adjustment gas into an inner space (processing space) of the unit casing 511, in particular, a space above the substrate W. The nitrogen gas supply 61 is connected to a nitrogen gas source 611, and also has branched conduits 612 respectively connected to the liquid processing units 51. In many cases, the nitrogen gas source 611 is a part of a factory power supply system in a semiconductor device manufacturing factory where the present substrate processing apparatus 1 is provided, but may be a stand-alone nitrogen gas tank. In the accompanying drawings, a double circle symbol denoted by "$N_2$" represents a nitrogen gas source or a nitrogen gas tank serving as a factory power supply.

Each branched conduit 612 is equipped with a flow rate control device 613. The flow rate control device 613 may include devices such as an opening/closing valve, a flow rate control valve, a flowmeter, and the like. These devices are illustrated by the same symbol (marked with an "x" in a square) in the accompanying drawings of the present disclosure.

A fan filter unit (not illustrated) may be provided at a ceiling portion of each liquid processing unit 51, and in this case, a downstream end of each branched conduit 612 may be connected to the fan filter unit.

The cup body 514 is connected to an exhaust conduit (cup exhaust conduit) 614 configured to suck an atmosphere inside the cup body 514. A mixed fluid containing a gas that fills the inner space of the unit casing 511 and the processing fluid supplied from the nozzle 513 to the substrate W is drained from the exhaust conduit 614. The exhaust conduits 614 of the plurality of liquid processing units 51 are joined into a single pipe conduit 615, and then, connected to a factory exhaust system EXH. In many cases, an acid-based exhaust conduit, an alkali-based exhaust conduit, and an organic-based exhaust conduit are provided separately as the exhaust conduit 614 and the pipe conduit 615, but a detailed description with reference to the drawings will not be provided.

The liquid processing unit may further include an exhaust conduit (not illustrated and also referred to as "unit exhaust conduit", "module exhaust conduit", or the like) configured to exhaust an atmosphere outside the cup body 514 within the unit casing 511. The exhaust conduit is connected to the above-described exhaust conduit 614.

The cup body 514 is also connected to a drain conduit (not illustrated) configured to drain out, from the cup body 514, the processing fluid scattered from the substrate W. The drain conduit is connected to a waste liquid line of the semiconductor device manufacturing factory.

The liquid processing unit 51 may be equipped with an air inlet opening (not illustrated) through which air (here, clean air which is filtered air in the clean room) as a purge gas is supplied into the inner space of the unit casing 511. The air serving as the purge gas is supplied so that workers can avoid the risk of lack of oxygen when a maintenance door 519 of the liquid processing unit 51 (see FIG. 1) is opened to perform maintenance of each liquid processing unit 51. An oxygen concentration within the liquid processing unit 51 can be detected by an oxygen concentration sensor 50S (see FIG. 1).

As illustrated in FIG. 1, a side surface of the unit casing 511 facing the substrate transfer zone 5B has an opening 517 through which an arm 531 of the substrate transfer mechanism 53 holding the substrate W can pass. The opening 517 is provided with a shutter 518. The shutter 518 is opened when the substrate transfer mechanism 53 carries the substrate W into and out from the liquid processing unit 51. The shutter 518 is closed when a processing is performed on the substrate W within the liquid processing unit 51 so that the inner space of the unit casing 511 can be isolated from the substrate transfer zone 5B. The shutter 518 may have the same configuration as a gate valve.

In the present exemplary embodiment, the liquid processing unit 51 sequentially performs a chemical liquid cleaning process, a rinsing process, and an organic solvent replacement process on the substrate W. In the chemical liquid cleaning process, a chemical liquid is supplied from the nozzle 513 to the substrate W being rotated. In the rinsing process, a rinse liquid is supplied from the nozzle 513 to the substrate W being rotated so that the chemical liquid and a reaction product remaining on the substrate W can be washed away. In the organic solvent replacement process, an organic solvent (IPA in the present exemplary embodiment) is supplied from the nozzle 513 to the substrate W being rotated so that the rinse liquid remaining on the substrate W can be replaced with the IPA. At the end of the organic solvent replacement process, by adjusting a rotation speed of the substrate W, the surface of the substrate W can be covered with an IPA liquid film (hereinafter, also referred to as "IPA puddle") having a desired thickness.

Each of the drying units 52 is configured to perform a supercritical drying processing on the substrate W on which the IPA puddle has been formed in the liquid processing unit 51. As illustrated in FIG. 1 and FIG. 3, the drying unit 52 includes a unit casing 521; a processing container (processing chamber) 522 provided within the unit casing 521; and a movable tray 523. The tray 523 can support a sheet of substrate W in a horizontal posture. The tray 523 can be moved between a processing position where the tray 523 is accommodated within the processing container 522 and a delivery position where the tray 523 is disposed away from the processing container 522 (as illustrated in FIG. 1 and FIG. 3) by a non-illustrated driving mechanism. The tray 523 at the processing position also functions as a cover configured to seal the processing container 522. The processing container 522 is connected to a supply line (not illustrated) through which a supercritical fluid (supercritical $CO_2$ in the present exemplary embodiment) is supplied and an exhaust line (not illustrated).

The supercritical drying processing is performed by supplying $CO_2$ in a supercritical state into the processing container 522 through the supply line, replacing the IPA remaining on the surface of the substrate W with the supercritical $CO_2$, and reducing the pressure inside the processing container 522 to convert the $CO_2$ from the supercritical state into a gas state.

The tray 523 at the delivery position is located within a space 524 (hereinafter, also referred to as "standby space 524") outside the processing container 522 in an inner space of the unit casing 521. A side surface of the unit casing 521 facing the substrate transfer zone 5B has a window 525 through which the arm 531 of the substrate transfer mechanism 53 which holds the substrate W can pass. The arm 531 that has entered the standby space 524 through the window 525 can deliver the substrate W to and from the tray 523 at the delivery position.

The standby space 524 of each drying unit 52 is connected to an exhaust conduit 616 through which an atmosphere inside the standby space 524 is exhausted. The exhaust conduit 616 is equipped with a valve 617, e.g., a damper, configured to control an opening degree thereof. The dampers are illustrated by the same symbol (marked with a circle and a line in a square) in the accompanying drawings of the present disclosure. As illustrated in FIG. 3, a plurality of exhaust conduits 616 is joined into a single pipe conduit 618. The pipe conduit 618 is connected to a circulation conduit 72. The pipe conduit 618 is equipped with a chemical filter 619, and the chemical filter 619 is configured to remove the organic component (IPA vapor) from a mixed gas (containing nitrogen gas, IPA vapor, and air component) flowing in the pipe conduit 618. Accordingly, it is possible to suppress the return of the IPA vapor into the substrate transfer zone 5B.

The nitrogen gas supply (first gas supply) 61, the exhaust conduit (first gas exhaust unit) 614, the pipe conduit 615, the exhaust conduit 616, the valve 617, the pipe conduit 618, the chemical filter 619, and the like constitute a first atmosphere control system 60 configured to control an atmosphere inside the processing zone 5A of the substrate processing area 5.

In the present exemplary embodiment, the processing zone 5A of the substrate processing area 5 has a multi-layered structure (herein, three-layered structure), and two liquid processing units 51 and two drying units 52 are provided at each layer. The above-described single substrate transfer mechanism 53 can access the delivery unit 40 and all of twelve processing units 51 and 52.

Hereafter, a control of an atmosphere inside the substrate transfer zone 5B of the substrate processing area 5 will be described with reference to mainly FIG. 2.

The atmosphere inside the substrate transfer zone 5B of the substrate processing area 5 is controlled by a second atmosphere control system 70. The second atmosphere control system 70 has a circulation system 71 including the substrate transfer zone 5B (space where the substrate is transferred) of the substrate processing area 5 and the circulation conduit 72 connected to the substrate transfer zone 5B. Hereafter, in the present specification, the "circulation system 71" may also be referred to as "second circulation system" since it is included in the second atmosphere control system 70. The second atmosphere control system 70 includes a second gas supply 73 (nitrogen gas supply) configured to supply a nitrogen gas as an atmosphere control gas to the second circulation system 71 and a second gas discharge unit 74 configured to discharge an atmosphere inside the second circulation system 71.

The second gas supply 73 includes a line 732 whose upstream end is connected to a nitrogen gas source 731 and whose downstream end is connected to the circulation conduit 72. The line 732 is equipped with a flow rate control device 733 including an opening/closing valve, a flow rate control valve, a flowmeter, and the like. The flow rate control device 733 may also include a regulator.

The second gas supply 73 may supply a nitrogen gas to a certain place of the second circulation system 71. That is, the second gas supply 73 may supply the nitrogen gas directly to the substrate transfer zone 5B rather than supplying the nitrogen gas to the circulation conduit 72.

The second gas discharge unit 74 includes a discharge line 741 branched from the circulation conduit 72 of the second circulation system 71; and a valve 742 (e.g., a damper) provided at the discharge line 741. The valve 742 may have only function of controlling an opening degree thereof, or may have functions of controlling the opening degree and blocking the opening degree. The discharge line 741 may be connected to the factory exhaust system or the gas recovery device in the semiconductor device manufacturing factory where the present substrate processing apparatus 1 is provided. The discharge line 741 is equipped with a pressure sensor 743 configured to detect the pressure inside the discharge line 741.

A fan filter unit 75A is provided at a ceiling portion of the substrate transfer zone 5B. Fans 75B are provided on a bottom portion of the substrate transfer zone 5B. The fan filter unit 75A is configured to send a gas inside the circulation conduit 72 into the substrate transfer zone 5B, and each of the fans 75B is configured to send the gas inside the substrate transfer zone 5B to the circulation conduit 72. That is, the fan filter unit 75A and the fans 75B guide the gas such that a circulation flow of the gas can be formed within the second circulation system 71.

An air inlet unit 76 configured to supply air (here, clean air which is filtered air in the clean room) as a purge gas into an inner space of the substrate transfer zone 5B may be provided. In the present exemplary embodiment, the air inlet unit 76 is configured to supply the air into the fan filter unit 75A. In this case, the air inlet unit 76 includes a line 761 whose one end is opened within the clean room where the present substrate processing apparatus 1 is provided and whose the other end is connected to the fan filter unit 75A; and an opening/closing valve 762 provided at the line 761. The air serving as the purge gas is supplied so that workers can avoid the risk of lack of oxygen when a maintenance door 55 of the substrate transfer zone 5B is opened to perform the maintenance of the whole substrate processing apparatus 1.

Hereafter, a control of an atmosphere inside the substrate transfer area 3 and the interface section 4 will be described.

The atmosphere inside the substrate transfer area 3 and the interface section 4 is controlled by a third atmosphere control system 80. The third atmosphere control system 80 has a circulation system 81 including the substrate transfer area 3; a space inside the delivery unit 40 of the interface section 4; and a circulation conduit 82 connected to the substrate transfer area 3 and the interface section 4. Hereafter, in the present specification, the "circulation system 81" may also be referred to as "third circulation system" since it is included in the third atmosphere control system 80. The third atmosphere control system 80 includes a third gas supply 83 (nitrogen gas supply) configured to supply a nitrogen gas as an atmosphere control gas to the third circulation system 81; and a third gas discharge unit 84 configured to discharge an atmosphere inside the third circulation system 81.

The third gas supply 83 includes a line 832 whose upstream end is connected to a nitrogen gas source 831 and whose downstream end is connected to the circulation conduit 82. The line 832 is equipped with a flow rate control device 833 including an opening/closing valve, a flow rate control valve, a flowmeter, and the like.

The third gas supply 83 may supply a nitrogen gas to a certain place of the third circulation system 81. That is, the third gas supply 83 may supply the nitrogen gas directly to the substrate transfer area 3 and/or the interface section 4 rather than supplying the nitrogen gas to the circulation conduit 82.

The third gas discharge unit 84 includes a discharge line 841 branched from the circulation conduit 82 and a valve 842 (e.g., a damper) provided at the discharge line 841. The valve 842 may have only function of controlling an opening degree thereof, or may have functions of controlling the opening degree and blocking the opening degree. The discharge line 841 may be connected to the factory exhaust system or the gas recovery device in the semiconductor device manufacturing factory where the present substrate processing apparatus 1 is provided. The discharge line 841 is equipped with a pressure sensor 843 configured to detect the pressure inside the discharge line 841.

In the exemplary embodiment illustrated in the drawings, the circulation conduit 82 is branched into two branched conduits 82A and 82B and joined again into a single conduit (circulation conduit 82). The substrate transfer area 3 is provided via the branched conduit 82A, and the interface section 4 is provided via the branched conduit 82B.

A fan filter unit 84A is provided on a ceiling portion of the substrate transfer area 3. A fan 85A is provided on a bottom portion of the substrate transfer area 3. The fan filter unit 84A is configured to send a gas inside the branched conduit 82A into the substrate transfer area 3, and the fan 85A is configured to send the gas inside the substrate transfer area 3 to the branched conduit 82A. That is, the fan filter unit 84A and the fan 85A guide the gas such that a circulation flow of the gas can be formed within the third circulation system 81.

Likewise, a fan filter unit 84B is provided on a ceiling portion of the interface section 4. A fan 85B is provided on a bottom portion of the interface section 4. The fan filter unit 84B is configured to send a gas inside the branched conduit 82B into the interface section 4, and the fan 85B is configured to send the gas inside the interface section 4 to the branched conduit 82B. That is, the fan filter unit 84B and the fan 85B also guide the gas such that a circulation flow of the gas can be formed within the third circulation system 81.

An air inlet unit 86 configured to supply air (here, clean air which is filtered air in the clean room) as a purge gas into an inner space of the substrate transfer area 3 may be provided. In the exemplary embodiment illustrated in the drawings, the air inlet unit 86 is configured to supply the air into the fan filter unit 84A. In this case, the air inlet unit 86 includes a line 861 whose one end is opened within the clean room where the present substrate processing apparatus 1 is provided and whose the other end is connected to the fan filter unit 84A; and an opening/closing valve 862 provided at the line 861. The air serving as the purge gas is supplied so that workers can avoid the risk of lack of oxygen when a maintenance door 35 of the substrate transfer area 3 is opened to perform the maintenance of the whole substrate processing apparatus 1. The purge gas is not limited to the clean air in the clean room and may be dry air or the like. Further, the purge gas inlet unit may be provided at another proper location within the substrate processing apparatus 1.

The substrate transfer mechanism 53 provided in the substrate transfer zone 5B of the substrate processing area 5 is equipped with a cover 532. The cover 532 is configured to suppress diffusion of a vaporized volatile material to the substrate transfer zone 5B when the substrate transfer mechanism 53 transfers the substrate W to which a film (e.g., IPA liquid film or organic film in a semisolid state) containing the volatile material is attached. The cover 532 may be used to suppress an undesirable diffusion of not only a gas derived from the volatile material but also a certain gas from the substrate W toward the substrate transfer zone 5B.

Figure 4:
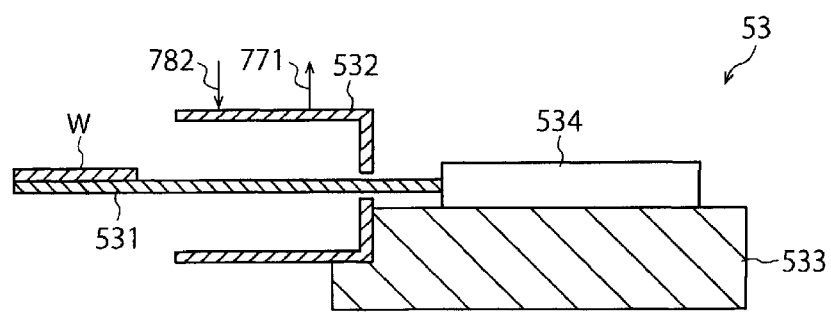
FIG. 4 is a schematic longitudinal cross-sectional view illustrating a configuration example of a cover provided in a substrate transfer mechanism shown in FIG. 2.

An example of the placement of the cover 532 in the case where the substrate transfer mechanism 53 is the multi-joint transfer robot will be described with reference to FIG. 4. The substrate transfer mechanism 53 includes the arm 531 configured to hold the substrate W. The arm 531 can be moved backwards and forwards in an X-direction (left-right direction in FIG. 4) by an X-directional driving mechanism 534. The X-directional driving mechanism 534 is fixed to a base member 533 capable of being moved in a Y-direction (horizontal direction perpendicular to the X-direction), a Z-direction (vertical direction) and a θ-direction (rotation direction around the vertical directional axis) by a non-illustrated YZθ-directional driving mechanism. The cover 532 is fixed to the base member 533. FIG. 4 illustrates that the arm 531 is moved forwards. When the arm 531 moves backwards, the substrate W held by the arm 531 is surrounded by the cover 532. A front of the cover 532 is opened, so that the arm 531 can perform a pick operation and a place operation (delivery operation for the substrate W to the spin chuck, the tray, and the delivery unit 40) for the substrate W without being interfered by the cover 532.

The configuration of the cover 532 is not limited to one illustrated in FIG. 4. The cover 532 may be equipped with a door (not illustrated) configured to open and close the front opening of the cover 532 when the arm 531 moves backwards.

As illustrated in FIG. 2, it is desirable that the cover 532 is equipped with an exhaust unit 77 configured to exhaust a gas from a space surrounded by the cover 532. In the exemplary embodiment illustrated in the drawings, the exhaust unit 77 includes an exhaust conduit 771 whose one end is connected to the cover 532 and whose the other end is connected to the circulation conduit 72; a valve 772 provided at the exhaust conduit 771; and a chemical filter 773. In this configuration, when the substrate W to which the film containing the volatile material is attached is held by the arm 531, it is possible to more securely suppress the diffusion of the vaporized volatile material into the substrate transfer zone 5B of the substrate processing area 5.

Further, a gas supply 78 configured to supply a nitrogen gas as an atmosphere control gas to the space surrounded by the cover 532 may be provided. In the exemplary embodiment illustrated in the drawings, the gas supply 78 includes a line 782 whose upstream end is connected to a nitrogen gas source 781 and whose downstream end is connected to the cover 532. The line 782 is equipped with a flow rate control device 783. Since the gas supply 78 is provided in addition to the exhaust unit 77, it is possible to more securely maintain the oxygen concentration around the substrate W to be low. However, if the exhaust unit 77 sucks an atmosphere inside the cover 532, the gas supply 78 may not be provided since a low-oxygen atmosphere is supplied into the cover 532 from the substrate transfer zone 5B.

In the present exemplary embodiment, the cover 532 is equipped with both the exhaust unit 77 and the gas supply 78. Hereafter, an exhaust operation by the exhaust unit 77 while supplying the nitrogen gas by the gas supply 78 will be referred to as "cover purge" for simplicity of explanation.

In the carry-in/out section 2, a gas supply 90 configured to supply a nitrogen gas as an atmosphere adjustment gas into the container C placed on the container holder 20 is provided.

The substrate processing apparatus 1 includes a control device 100. The control device 100 is, e.g., a computer, and includes a controller 101 and a storage unit 102. The storage unit 102 stores a program for controlling various processings that are executed in the substrate processing system 1. The controller 101 reads and executes the program stored in the storage unit 102 to control the substrate processing apparatus 1.

Further, the program may be a program that have been stored in a computer-readable storage medium and may be installed in the storage unit 102 of the control device 100 from other storage mediums. Examples of the computer-readable storage medium include a hard disc (HD), a flexible disc (FD), a compact disc (CD), a magnet optical disc (MO), and a memory card.

Hereafter, an operation method of the substrate processing apparatus 1 will be described. The operations of the substrate processing apparatus 1 to be described below are performed under the control of the control device 100.

Before the normal operations of the substrate processing apparatus 1 starts, the entire inner space of the substrate processing apparatus 1 has substantially the same atmosphere as the inside of the clean room where the substrate processing apparatus 1 is provided. To prepare for starting of the normal operations of the substrate processing apparatus 1, the inner spaces of the substrate transfer area 3, the delivery unit 40 and the substrate transfer zone 5B (of the substrate processing area 5) are controlled to have a low-oxygen atmosphere.

At an early stage, the atmosphere control is performed as follows. The fan filter unit 75A and the fans 75B are operated. In this state, while discharging the air (atmosphere in the clean room) within the circulation system (the substrate transfer zone 5B and the circulation conduit 72) from the second gas discharge unit 74 of the second atmosphere control system 70, the nitrogen gas as the atmosphere control gas is supplied from the second gas supply 73 at a high flow rate. Therefore, the air within the circulation system is replaced at least partially with the nitrogen gas. This operation is continuously performed until the oxygen concentration in the substrate transfer zone 5B detected by an oxygen concentration sensor 70S reaches a desired level. When the oxygen concentration in the substrate transfer zone 5B approximately reaches the desired level, the discharge of the gas from the second gas discharge unit 74 is stopped or greatly reduced. Accordingly, the supply flow rate of the atmosphere control gas from the second gas supply 73 is greatly reduced.

Then, feedback control of the supply amount of the gas supplied by the second gas supply 73 and the discharge amount of the gas discharged from the second gas discharge unit 74 is performed in order to maintain the pressure detected by the pressure sensor 743 (which becomes an indicator of the pressure inside the substrate transfer zone 5B) within a desired range. The pressure inside the substrate transfer zone 5B varies depending on the difference between the supply amount of the gas supplied by the second gas supply 73 and the discharge amount of the gas discharged from the second gas discharge unit 74. If it is not necessary to change the oxygen concentration and IPA vapor concentration (to be described in detail later), the supply amount of the gas supplied by the second gas supply 73 is suppressed to a necessary minimum. Further, feedback control of the supply amount of the gas supplied by the second gas supply 73 and the discharge amount of the gas discharged from the second gas discharge unit 74 is performed in order to maintain the oxygen concentration detected by the oxygen concentration sensor 70S within a desired range. If the oxygen concentration increases, both the supply amount of the gas supplied by the second gas supply 73 and the discharge amount of the gas discharged from the second gas discharge unit 74 are increased. In this case, the difference between the supply amount of the gas supplied by the second gas supply 73 and the discharge amount of the gas discharged from the second gas discharge unit 74 is controlled such that the pressure inside the substrate transfer zone 5B is maintained within a desired range.

The fan filter units 84A and 84B and the fans 85A and 85B are operated at substantially the same time as the above-described operation of the second atmosphere control system 70. In this state, while discharging the gas inside the circulation system (the substrate transfer area 3, the delivery unit 40 and the circulation conduit 82) from the third gas discharge unit 84 of the third atmosphere control system 80, the nitrogen gas as the atmosphere control gas is supplied from the third gas supply 83 at a high flow rate. Therefore, the air (air in the clean room) within the circulation system is replaced at least partially with the nitrogen gas. This operation is also continuously performed until the oxygen concentration in the substrate transfer area 3 detected by an oxygen concentration sensor 30S reaches a desired level. When the oxygen concentration approximately reaches the desired level, the oxygen concentration sensor 30S stops or greatly reduces the discharge of the gas from the third gas discharge unit 84 and thus greatly reduces the supply flow rate of the atmosphere control gas from the third gas supply 83.

Then, feedback control of the supply amount of the gas supplied by the third gas supply 83 and the discharge amount of the gas discharged from the third gas discharge unit 84 is performed in order to maintain the pressure detected by the pressure sensor 843 (which becomes an indicator of the pressure inside the substrate transfer area 3) within a desired range. The pressure inside the substrate transfer area 3 varies depending on the difference between the supply amount of the gas supplied by the third gas supply 83 and the discharge amount of the gas discharged from the third gas discharge unit 84. If it is not necessary to change the oxygen concentration, the supply amount of the gas supplied by the third gas supply 83 is suppressed to a necessary minimum. Further, feedback control of the supply amount of the gas supplied by the third gas supply 83 and the discharge amount of the gas discharged from the third gas discharge unit 84 is performed in order to maintain the oxygen concentration detected by the oxygen concentration sensor 30S within a desired range. If the oxygen concentration increases, both the supply amount of the gas supplied by the third gas supply 83 and the discharge amount of the gas discharged from the third gas discharge unit 84 are increased. In this case, the difference between the supply amount of the gas supplied by the third gas supply 83 and the discharge amount of the gas discharged from the third gas discharge unit 84 is controlled such that the pressure inside the substrate transfer area 3 is maintained within a desired range.

A flow path for high-flow rate supply and a flow path for low-flow rate supply may be provided in parallel to each other in each of the second gas supply 73 and the third gas supply 83. Accordingly, it is possible to rapidly replace the atmosphere in the clean room with the low-oxygen atmosphere.

Also, desirably, the pressure inside the substrate transfer zone 5B is controlled to be slightly higher than the pressure inside the liquid processing unit 51. Accordingly, it is possible to suppress or greatly reduce the leakage of the atmosphere (chemical liquid component, organic solvent vapor, etc.) in the liquid processing unit 51 into the substrate transfer zone 5B.

Further, desirably, the pressure inside the substrate transfer area 3 and the pressure inside the delivery unit 40 are controlled to be slightly higher than the pressure inside the substrate transfer zone 5B. Accordingly, it is possible to suppress or greatly reduce the supply of the gas component (leaked from the liquid processing unit 51 or diffused from the substrate W) in the substrate transfer zone 5B into the substrate transfer area 3 and the delivery unit 40.

As described above, the inner spaces of the substrate transfer area 3, the delivery unit 40 and the substrate transfer zone 5B have the low-oxygen atmosphere of the desired pressure. Then, the substrates W to be processed in the substrate processing apparatus 1 are carried into the container holder 20 from the outside of the substrate processing apparatus 1 in a state where the substrates W are accommodated in the containers C filled with an inert gas (e.g., nitrogen gas). As for each substrate W, it is not desirable to place the surface of the substrate W in a relatively high-oxygen atmosphere similar to the air (atmosphere in the clean room). The containers C placed on the container holder 20 are supplied with the nitrogen gas from the gas supply 90. A cover (not illustrated) of each container C is opened in a state where the front opening of the container C is in close contact with the front panel 31 of the substrate transfer area 3. Thus, the inside of the container C communicates with the inner space of the substrate transfer area 3.

Then, the substrate transfer device 32 provided in the substrate transfer area 3 takes out the substrate W from the container C and transfers the substrate W to the delivery unit 40. The substrate transfer mechanism 53 provided in the substrate transfer zone 5B of the substrate processing area 5 takes out the substrate held by the delivery unit 40 and carries the substrate W into the previously designated liquid processing unit 51 according to a predetermined transfer schedule. At this time, before the substrate W is started to be carried into the liquid processing unit 51, the nitrogen gas is supplied into the unit casing 511 of the liquid processing unit 51 from the nitrogen gas supply 61 in the state where the shutter 518 is closed. When the oxygen concentration in the unit casing 511 decreases to a prescribed concentration, the shutter 518 is opened, and then, immediately after the substrate W is carried into the liquid processing unit 51, the shutter 518 is closed. During the processing on the substrate W, the inside of the unit casing 511 is maintained at the desired low-oxygen atmosphere.

The liquid processing unit 51 performs the predetermined processings on the substrate W and finally forms the IPA liquid film on the surface (device formation surface) of the substrate W.

When the processing of the liquid processing unit 51 is ended, the shutter 518 is opened and the substrate transfer mechanism 53 takes out the substrate W from the liquid processing unit 51. When the substrate W is taken out from the liquid processing unit 51, the shutter 518 is closed immediately. Further, the supply of the nitrogen gas from the nitrogen gas supply 61 into the unit casing 511 of the liquid processing unit 51 is stopped. Accordingly, it is possible to suppress the consumption of the nitrogen gas which is relatively expensive. Since the IPA is highly volatile, the IPA vapor is present within the liquid processing unit 51. For this reason, the IPA vapor may leak from the unit casing 511 of the liquid processing unit 51 to the substrate transfer zone 5B through the opening 517. As described above, this leakage can be greatly reduced by controlling the pressure inside the inner space of the substrate transfer zone 5B to be higher than the pressure inside the unit casing 511. However, either way, the IPA liquid film is present on the surface of the substrate W, and, thus, the IPA vapor may be diffused around the substrate W.

To suppress the increase in the IPA concentration in the substrate transfer zone 5B, the above-stated cover purge is performed. The cover purge is started at a time when, slightly before or slightly after the arm 531 of the substrate transfer mechanism 53 takes out the substrate W from the liquid processing unit 51 and moves backwards and then carries the substrate W into the cover 532. Accordingly, it is possible to suppress or greatly reduce the diffusion of the IPA vapor from the substrate W held by the arm 531 into the substrate transfer zone 5B. Further, when, slightly before or slightly after the shutter 518 is opened, both the supply flow rate of the nitrogen gas to the circulation conduit 72 by the second gas supply 73 and the discharge flow rate of the nitrogen gas from the circulation conduit 72 by the second gas discharge unit 74 are increased. The increase of the supply flow rate and the discharge flow rate is performed under the condition that the pressure inside the substrate transfer zone 5B is not changed substantially. Accordingly, even if the IPA vapor is diffused from the substrate W into the substrate transfer zone 5B, it is possible to suppress or reduce the increase of the IPA concentration in the substrate transfer zone 5B.

The arm 531 of the substrate transfer mechanism 53 enters the standby space 524 of the drying unit 52 through the window 525 and delivers the substrate W taken out from the liquid processing unit 51 to the tray 523 at the delivery position. Then, the arm 531 is retreated from the standby space 524. When, slightly before or slightly after the substrate W enters the standby space 524, the opening degree of the valve (damper) 617 is increased. Thus, the flow of the gas supplied from the substrate transfer zone 5B into the standby space 524 through the window 525 and returned to the circulation conduit 72 through the exhaust conduit 616 and the pipe conduit 618 is formed. Accordingly, it is possible to suppress the increase of the IPA concentration in the standby space 524. Desirably, the cover purge is stopped when the arm 531 of the substrate transfer mechanism 53 enters the standby space 524 of the drying unit 52. Accordingly, it is possible to reduce the consumption of the nitrogen gas which is relatively expensive. The cover purge may be stopped when the arm 531 places the substrate W on the tray 523.

Immediately after the substrate W is placed on the tray 523, the tray 523 is moved to the processing position within the processing container 522. Since the processing container 522 is sealed with the tray 523, the IPA vapor is not diffused from the substrate W into the standby space 524. For this reason, when, slightly before or slightly after the tray 523 is moved to the processing position, the valve 617 is closed or the opening degree of the valve 617 is decreased. The opening degree of the valve 617 may be maintained high. However, in this case, driving force for circulating the gas within the circulation system 71 is consumed unnecessarily. Thus, when the substrate W to which the IPA liquid film is attached is not present in the standby space 524 (or when the substrate W is present in the processing container 522), it is desirable to suppress the gas flow through the exhaust conduit 616 and the pipe conduit 618.

If the arm 531 of the substrate transfer mechanism 53 enters the standby space 524, both the supply flow rate of the nitrogen gas to the circulation conduit 72 by the second gas supply 73 and the discharge flow rate of the nitrogen gas from the circulation conduit 72 by the second gas discharge unit 74 may be decreased. If the arm 531 of the substrate transfer mechanism 53 enters the standby space 524, the IPA vapor diffused from the substrate W is a gas flow supplied from the substrate transfer zone 5B into the standby space 524 through the window 525. Therefore, it is difficult that the IPA vapor leaks to the substrate transfer zone 5B. Also, it is possible to reduce the consumption of the nitrogen gas which is relatively expensive by decreasing both the supply flow rate of the nitrogen gas from the second gas supply 73 and the discharge flow rate of the nitrogen gas from the second gas discharge unit 74. Further, the IPA vapor included in the gas discharged from the standby space 524 through the exhaust conduit 616 is removed by the chemical filter 619 provided at the pipe conduit 618.

After the tray 523 is moved to the processing position, the supercritical drying processing is performed in a commonly known sequence in the processing container 522 of the drying unit 52.

After the supercritical drying processing is performed on the substrate W, the tray 523 is moved to the standby position, and the arm 531 of the substrate transfer mechanism 53 takes out the substrate W from the tray 523 and transfers the substrate W to the delivery unit 40. Then, the substrate W is returned back to the original container C by the substrate transfer device 32.

According to the above-described embodiment, it is possible to reduce the consumption amount of the atmosphere adjustment gas while securely controlling the atmosphere of the space within the substrate processing apparatus 1.

In the above-described embodiment, the substrate processing apparatus 1 includes the liquid processing unit 51 configured to perform the liquid processing to finally forms the IPA liquid film on the surface of the substrate W; and the drying unit 52 configured to perform the supercritical drying processing on the substrate W to which the IPA liquid film is attached, but is not limited thereto. For example, the liquid processing unit may form an organic film in a semisolid state on the surface of the substrate W, and the drying unit 52 may be configured as a baking unit configured to bake the organic film in a semisolid state at a high temperature. Further, for example, the liquid processing unit may form a film of a sublimable material having fluidity on the surface of the substrate W, and the drying unit 52 may be configured as a heating unit configured to solidify and/or sublimate the film of the sublimable material.

The substrate processing apparatus 1 may include only the liquid processing unit 51 as the processing unit without including the drying unit 52. Even in this case, when the shutter 518 of the liquid processing unit 51 is opened, the atmosphere (e.g., IPA vapor used in the drying process, or mist of chemical liquid) inside the liquid processing unit 51 may leak into the substrate transfer zone 5B. Therefore, the above-described atmosphere control technique (e.g., performing the exhaust from the circulation system 72 while the shutter 518 is being opened) can be applicable.

In the above-described embodiment, the nitrogen gas is used as the atmosphere control gas. However, any atmosphere control gas capable of forming a desired atmosphere in the space where the substrate can be present may be used. For example, dry air may be used as the atmosphere control gas to form a low-humidity atmosphere. For example, a carbon dioxide gas may be used instead of the nitrogen gas to form the low-oxygen atmosphere. In general, such atmosphere control gases are relatively expensive. Therefore, it is necessary to suppress the consumption of the atmosphere control gas by supplying the atmosphere control gas only if required and exhausting the atmosphere control gas only if required. Accordingly, it is possible to reduce the running cost of the substrate processing apparatus.

The substrate W as a processing target is not limited to the semiconductor wafer, and may be any one of various substrates, such as a glass substrate, a ceramic substrate and the like, used in the field of semiconductor device manufacturing.

According to the embodiments, it is possible to reduce the consumption amount of the atmosphere adjustment gas while securely controlling the atmosphere of the space within the substrate processing apparatus.

The embodiments disclosed herein are illustrative in all aspects and not limited thereto. The above-described embodiments may be omitted, substituted, or changed in various forms without departing from the scope of the appended claims.

From the foregoing, it will be appreciated that various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing apparatus, comprising:
    a substrate processing area including a processing zone in which at least one liquid processing unit configured to perform a liquid processing on a substrate is provided and a substrate transfer zone in which a substrate transfer mechanism configured to transfer the substrate to the at least one liquid processing unit is provided;
    a substrate transfer area including a substrate transfer device configured to take out the substrate from a substrate accommodating container held by a container holder and transfer the substrate to a position allowed to be accessed by the substrate transfer mechanism of the substrate processing area;
    a first atmosphere control system configured to control an atmosphere inside the processing zone of the substrate processing area; and
    a second atmosphere control system configured to control an atmosphere inside the substrate transfer zone of the substrate processing area,
    wherein the first atmosphere control system includes a first gas supply and a first gas discharge unit, and when the liquid processing is performed in each of the at least one liquid processing unit, an atmosphere control gas is supplied to the at least one liquid processing unit by the first gas supply and an atmosphere inside the at least one liquid processing unit is discharged by the first gas discharge unit,
    the second atmosphere control system includes a circulation system having the substrate transfer zone of the substrate processing area and a circulation conduit connected to the substrate transfer zone, a second gas supply configured to supply an atmosphere control gas to the circulation system of the second atmosphere control system and a second gas discharge unit configured to discharge an atmosphere inside the circulation system of the second atmosphere control system, and the second atmosphere control system is configured to circulate an atmosphere adjustment gas within the circulation system of the second atmosphere control system, and when at least one of the at least one liquid processing unit is opened to the substrate transfer zone, the second atmosphere control system is configured such that an atmosphere inside the circulation system of the second atmosphere control system is discharged by the second gas discharge unit,
    wherein the substrate transfer mechanism provided in the substrate transfer zone of the substrate processing area includes a substrate holding arm configured to hold the substrate and a cover provided to surround the substrate held by the substrate holding arm, and the substrate transfer mechanism is equipped with an exhaust unit configured to discharge an atmosphere from a space surrounded by the cover,
    wherein the exhaust unit includes an exhaust conduit, the exhaust conduit having a first end connected to the cover and a second end connected to the circulation conduit.

2. The substrate processing apparatus of claim 1, further comprising:
    a third atmosphere control system configured to control an atmosphere inside the substrate transfer area,
    wherein the third atmosphere control system includes a circulation system including the substrate transfer area and the circulation conduit connected to the substrate transfer area, a third gas supply configured to supply an atmosphere control gas to the circulation system of the third atmosphere control system and a third gas discharge unit configured to discharge an atmosphere inside the circulation system of the third atmosphere control system, and the third atmosphere control system is configured such that an atmosphere adjustment gas is circulated within the circulation system of the third atmosphere control system.

3. The substrate processing apparatus of claim 2,
    wherein at least one drying unit is provided in the processing zone.

4. The substrate processing apparatus of claim 3,
    wherein when the substrate processed by the at least one liquid processing unit is carried out from the at least one liquid processing unit, the at least one liquid processing unit is configured to perform a processing of forming, on the substrate, a liquid film or a film which is not completely solidified and from which a solvent is allowed to be vaporized, and
    the drying unit is configured to dry the film.

5. The substrate processing apparatus of claim 3,
    wherein when the substrate processed by the at least one liquid processing unit is carried out from the at least one liquid processing unit, the at least one liquid processing unit is configured to perform a processing of forming a liquid film of an organic solvent on the surface of the substrate, and
    the drying unit is configured as a supercritical drying unit configured to dry the substrate, on which the liquid film of the organic solvent is formed, by using a supercritical fluid as a processing fluid.

6. The substrate processing apparatus of claim 2, wherein the substrate transfer mechanism is further equipped with a gas supply configured to supply an atmosphere adjustment gas to the space surrounded by the cover.

7. The substrate processing apparatus of claim 2, wherein when the liquid processing is not performed in each of the at least one liquid processing unit, the first atmosphere control system is configured such that the supply of the atmosphere control gas from the first gas supply to the at least one liquid processing unit is stopped.

8. The substrate processing apparatus of claim 2, wherein when the substrate transfer mechanism transfers the substrate on which a liquid film or a film which is not completely solidified and from which a solvent is allowed to be vaporized is formed, the second atmosphere control system is configured such that the atmosphere inside the circulation system of the second atmosphere control system is discharged by the second gas discharge unit.

9. The substrate processing apparatus of claim 1, wherein at least one drying unit is provided in the processing zone.

10. The substrate processing apparatus of claim 9, wherein when the substrate processed by the at least one liquid processing unit is carried out from the at least one liquid processing unit, the at least one liquid processing unit is configured to perform a processing of forming, on the substrate, a liquid film or a film which is not completely solidified and from which a solvent is allowed to be vaporized, and the drying unit is configured to dry the film.

11. The substrate processing apparatus of claim 9, wherein when the substrate processed by the at least one liquid processing unit is carried out from the at least one liquid processing unit, the at least one liquid processing unit is configured to perform a processing of forming a liquid film of an organic solvent on the surface of the substrate, and the drying unit is configured as a supercritical drying unit configured to dry the substrate, on which the liquid film of the organic solvent is formed, by using a supercritical fluid as a processing fluid.

12. The substrate processing apparatus of claim 9, wherein the substrate transfer mechanism is further equipped with a gas supply configured to supply an atmosphere adjustment gas to the space surrounded by the cover.

13. The substrate processing apparatus of claim 1, wherein the substrate transfer mechanism is further equipped with a gas supply configured to supply an atmosphere adjustment gas to the space surrounded by the cover.

14. The substrate processing apparatus of claim 1, wherein when the liquid processing is not performed in each of the at least one liquid processing unit, the first atmosphere control system is configured such that the supply of the atmosphere control gas from the first gas supply to the at least one liquid processing unit is stopped.

15. The substrate processing apparatus of claim 1, wherein when the substrate transfer mechanism transfers the substrate on which a liquid film or a film which is not completely solidified and from which a solvent is allowed to be vaporized is formed, the second atmosphere control system is configured such that the atmosphere inside the circulation system of the second atmosphere control system is discharged by the second gas discharge unit.

* * * * *